(12) United States Patent
Kuo et al.

(10) Patent No.: US 12,309,931 B2
(45) Date of Patent: May 20, 2025

(54) ELECTRONIC DEVICE

(71) Applicant: Innolux Corporation, Miao-Li (TW)

(72) Inventors: Chin-Cheng Kuo, Miao-Li (TW);
Chia-Chun Yang, Miao-Li (TW);
Wen-Cheng Huang, Miao-Li (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/544,586

(22) Filed: Dec. 19, 2023

(65) Prior Publication Data
US 2024/0121899 A1   Apr. 11, 2024

Related U.S. Application Data

(60) Continuation of application No. 17/223,054, filed on Apr. 6, 2021, now Pat. No. 11,889,627, which is a
(Continued)

(30) Foreign Application Priority Data

Nov. 21, 2016   (CN) .......................... 201611021201.5

(51) Int. Cl.
*H05K 1/14* (2006.01)
*H05K 1/18* (2006.01)
(Continued)

(52) U.S. Cl.
CPC ............. *H05K 1/148* (2013.01); *H05K 1/181* (2013.01); *H05K 3/284* (2013.01); *H05K 3/303* (2013.01);
(Continued)

(58) Field of Classification Search
CPC .... H05K 1/14; H05K 1/144–148; H05K 1/18; H05K 1/181–187; H05K 3/284; H05K 3/303; H05K 3/361; H05K 7/00; H05K 7/08; G02F 1/1399; G02F 1/13452; G02F 1/13305
(Continued)

(56) References Cited

U.S. PATENT DOCUMENTS 6,266,119 B1 * 7/2001 Takahashi .............. H05K 3/361
349/149
6,624,868 B1 * 9/2003 Terukina ............. G02F 1/13452
349/149
(Continued)

*Primary Examiner* — Tuan T Dinh
(74) *Attorney, Agent, or Firm* — McClure, Qualey & Rodack, LLP

(57) ABSTRACT

An electronic device includes a substrate, a plurality of flexible circuit boards, a plurality of ICs and an insulator. The flexible circuit boards are disposed on the substrate. In a top view of the electronic device, the flexible circuit boards are overlapped with an edge of the substrate. The ICs are disposed on the substrate. The insulator is disposed on the flexible circuit boards and contacted the ICs, wherein the insulator has a first side and a second side opposite to the first side and the first side is closer to the edge than the second side. Along a first direction perpendicular to an extension direction of the edge, a first minimum distance between the second side and one of the ICs is less than a second minimum distance between the second side and one of the flexible circuit boards.

15 Claims, 5 Drawing Sheets

Related U.S. Application Data continuation of application No. 16/662,118, filed on Oct. 24, 2019, now Pat. No. 10,999,931, which is a division of application No. 15/796,917, filed on Oct. 30, 2017, now Pat. No. 10,531,563.

(51) Int. Cl.
  *H05K 3/28* (2006.01)
  *H05K 3/30* (2006.01)
  *H05K 3/36* (2006.01)

(52) U.S. Cl.
  CPC ....... H05K 3/361 (2013.01); *H05K 2201/041* (2013.01); *H05K 2201/09027* (2013.01); *H05K 2201/10106* (2013.01); *H05K 2201/10128* (2013.01); *H05K 2201/10522* (2013.01); *H05K 2203/0126* (2013.01)

(58) Field of Classification Search
  USPC ........ 361/749–750, 760, 767, 770–777, 803; 174/254–260; 349/149–153
  See application file for complete search history.

(56) References Cited

U.S. PATENT DOCUMENTS

| | | | | |
|---|---|---|---|---|
| 6,756,975 | B1 * | 6/2004 | Kishida | H01L 23/49838 345/204 |
| 7,515,240 | B2 * | 4/2009 | Lu | H05K 3/323 349/149 |
| 7,573,471 | B2 * | 8/2009 | Park | G09G 3/30 345/206 |
| 8,274,633 | B2 * | 9/2012 | Ino | G02F 1/133308 349/150 |
| 8,289,492 | B2 * | 10/2012 | Saimen | H05K 1/0269 349/149 |
| 8,450,838 | B2 * | 5/2013 | Gyoda | H10K 50/8426 257/680 |
| 8,982,575 | B2 * | 3/2015 | Lai | G09F 9/33 445/25 |
| 2014/0063433 | A1 * | 3/2014 | Benson | G02F 1/1341 349/155 |

* cited by examiner

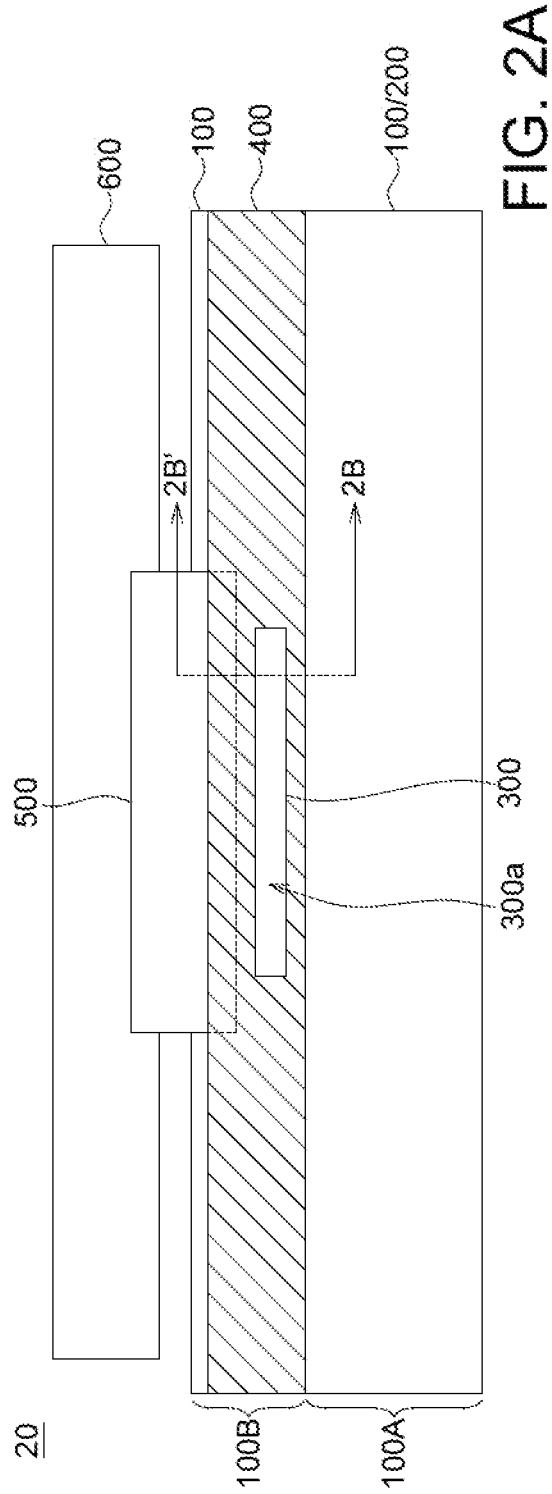
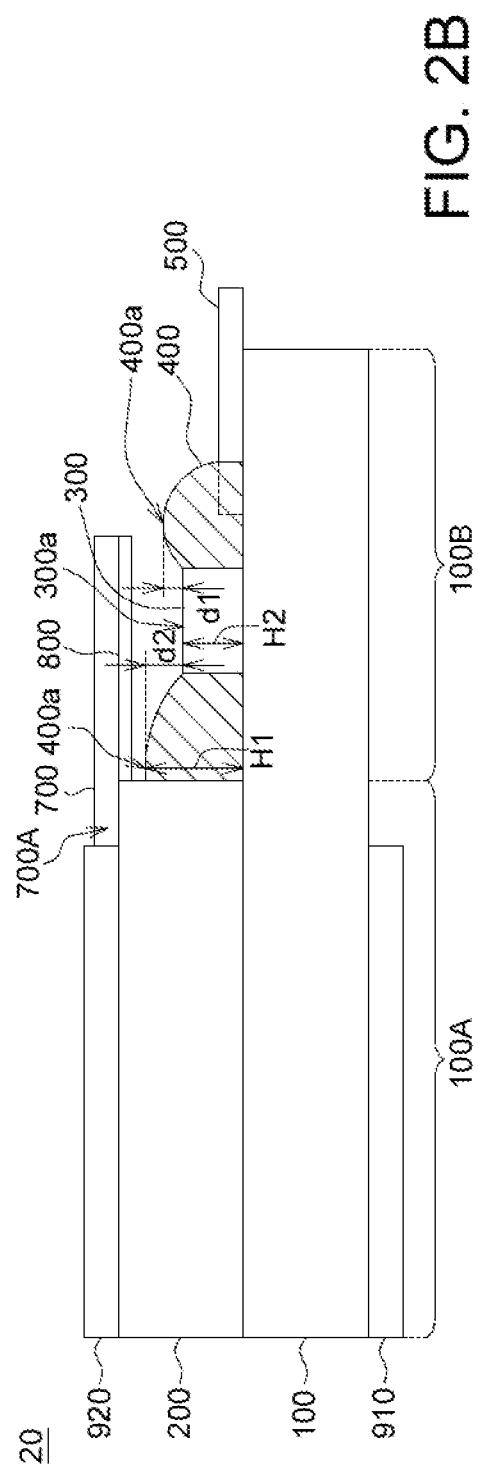

ELECTRONIC DEVICE

This application is a Continuation application of U.S. application Ser. No. 17/223,054, filed Apr. 6, 2021, which is a Continuation application of U.S. application Ser. No. 16/662,118, filed Oct. 24, 2019, which is a Divisional application of U.S. application Ser. No. 15/796,917, filed Oct. 30, 2017, which claims the benefit of People's Republic of China Application Serial No. 201611021201.5, filed Nov. 21, 2016, the subject matters of which are incorporated herein by references.

BACKGROUND OF THE DISCLOSURE

Field of the Disclosure

The disclosure relates in general to a display device and a manufacturing method thereof, and more particularly to a display device having a protection layer for drive IC and a manufacturing method thereof.

Description of the Related Art

In response to people's pursuit of high brightness and high color of the visual screen, the technology of color display is developed and used. The display is used in many fields of people's daily life such as advertising billboard, TV, and car navigation. However, the development of various types of display screens including the cathode ray tube (CRT) screen to the plasma screen, the liquid crystal screen, and the organic light emitting diode (OLED) screens all encounter similar problems.

Therefore, how to provide a display panel having excellent display quality and technology competiveness has become a prominent task for the industries.

SUMMARY OF THE DISCLOSURE

The disclosure is directed to a display device. In the display device of an embodiment, the maximum height of the protection layer is larger than the maximum height of the drive IC, such that the protection layer can protect the drive IC and avoid an external force damaging or breaking the drive IC. Detailed descriptions of the present disclosure are disclosed in a number of embodiments below with accompanying drawings.

According to one embodiment of the present disclosure, a manufacturing method of a display device is provided. The manufacturing method of the display device includes the following steps: A first substrate having a first region and a second region is provided. A second substrate is disposed on the first substrate, wherein the second substrate is overlapping the first region. At least one drive IC is disposed on the second region of the first substrate. A protection layer is disposed on the second region and enclosing the at least one drive IC, wherein the protection layer has a maximum height larger than a maximum height of the at least one drive IC.

The above and other aspects of the disclosure will become better understood with regard to the following detailed description of the preferred but non-limiting embodiment(s). The following description is made with reference to the accompanying drawings.

BRIEF DESCRIPTION OF THE DRAWINGS

FIG. 2A is a top view of a display device according to another embodiment of the present disclosure.

FIG. 2B is a cross-sectional view along the cross-sectional line 2B-2B' of FIG. 2A.

DETAILED DESCRIPTION OF THE DISCLOSURE

According to the display device disclosed in the embodiments of the present disclosure, the maximum height of the protection layer is larger than the maximum height of the drive IC, therefore the protection layer can protect the drive IC, or avoid damaging or breaking the drive IC by external force. Detailed descriptions of the present disclosure are disclosed in a number of embodiments below with accompanying drawings. Designations common to the accompanying drawings and embodiments are used to indicate identical or similar elements. It should be noted that the accompanying drawings are simplified such that the embodiments can be more clearly described. Technical structures disclosed in the embodiments are for explanatory and exemplary purposes, which are not for limiting the scope of protection of the present disclosure. Any person having ordinary skill in the technology of the present disclosure can make suitable modifications or variations to the structures according to the needs in actual implementations.

Figure 1A:
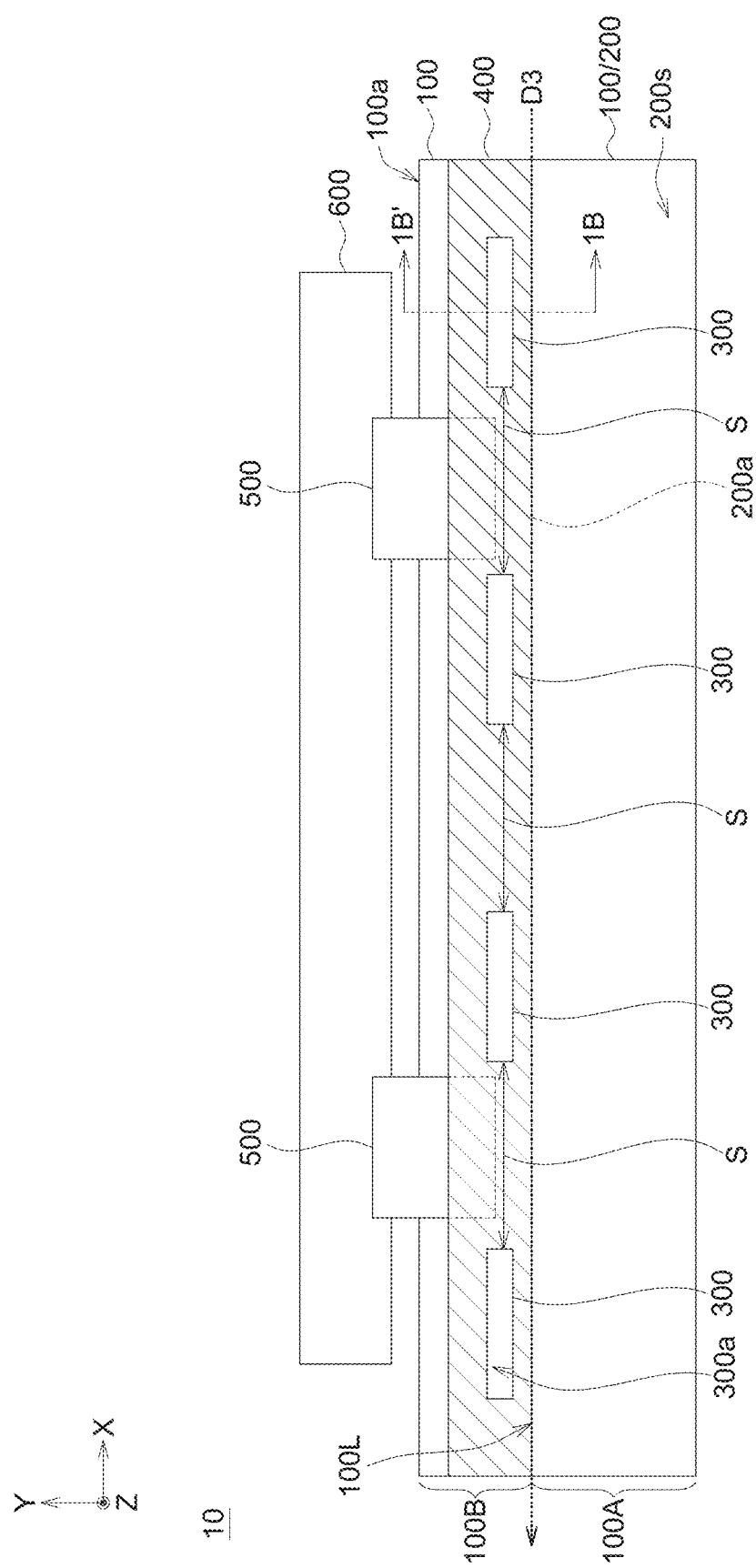
FIG. 1A is a top view of a display device according to an embodiment of the present disclosure.
Figure 1B:
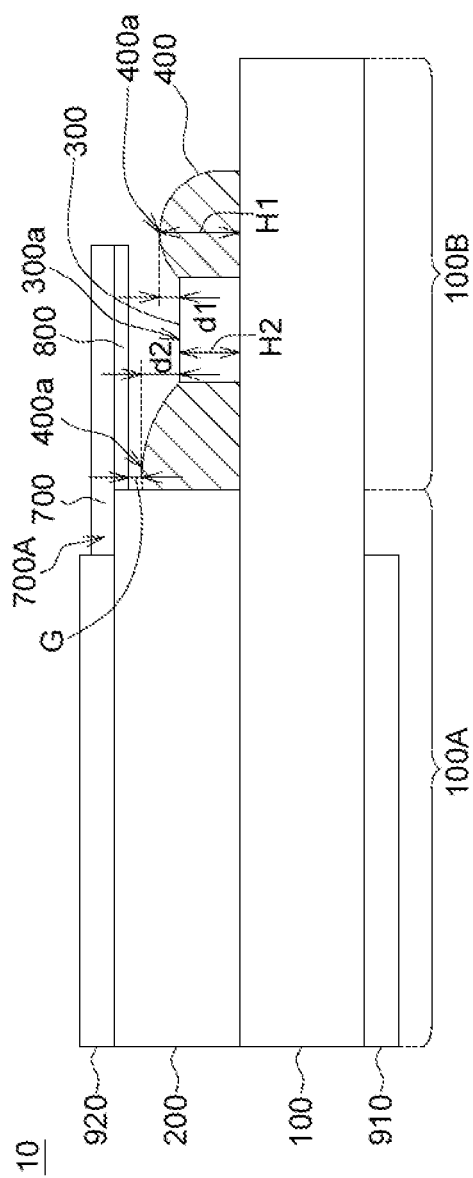
FIG. 1B is a cross-sectional view along the cross-sectional line 1B-1B' of FIG. 1A.

FIG. 1A is a top view of a display device according to an embodiment of the present disclosure. FIG. 1B is a cross-sectional view along the cross-sectional line 1B-1B' of FIG. 1A. As indicted in FIG. 1A-1B, the display device 10 includes a first substrate 100, a second substrate 200, a drive IC 300 and a protection layer 400. The first substrate 100 has a first region 100A and a second region 100B, and the first region 100A may be near to the second region 100B. The second substrate 200 is correspondingly disposed on the first region 100A of the first substrate 100. In other words, the second substrate 200 overlaps the first substrate 100 on the first region 100A. The drive IC 300 is disposed on the second region 100B of the first substrate 100. The protection layer 400 is disposed on the second region 100B of the first substrate 100 and adjacent to the drive IC 300, and the protection layer 400 has a maximum height H1 larger than a maximum height H2 of the drive IC 300. In an embodiment as indicated in FIG. 1B, the maximum height H1 of the protection layer 400 is a maximum height from the bottom of the protection layer 400 to the top surface 400a of the protection layer 400; the maximum height H2 of the drive IC 300 is a maximum height from the bottom of the drive IC 300 to the top surface 300a of the drive IC 300. In the present embodiment, the display device 10 includes a plurality of drive ICs 300 disposed on the second region 100B of the first substrate 100 and arranged in a direction parallel to a lateral side 200a of the second substrate 200, or parallel to a lateral side 100a of the first substrate 100.

In some embodiments, the top surface 400a of the protection layer 400 is higher than the top surface 300a of the drive IC 300.

In some embodiments, the first region 100A may include a display region; the second region B may include a circuit region.

In an embodiment as indicated in FIG. 1B, the top surface 400a of the protection layer 400 may be higher than the top surface 300a of the drive IC 300, and a distance is between the top surface 400a of the protection layer 400 and the top surface 300a of the drive IC 300 in a normal direction of first substrate. In some embodiments, the distance ranges from 0.01 mm to 0.35 mm, but the disclosure is not limited thereto.

Since the height from the bottom of the protection layer 400 to the top surface 400a may be the same or different in different regions of protection layer 400, the top surface 400a of the protection layer 400 may have the same or different heights in different regions. At least part of the top surface of the protection layer is curved. For example, top surface 400a of protection layer 400 may not be flat plane, and thus the distance between the top surface 400a and the top surface 300a may be the same or different in different regions. As indicated in FIG. 1B, the distance d2 between the top surface 400a and the top surface 300a located close to the second substrate 200 may be larger than the distance d1 between the top surface 400a, and the top surface 300a located close to an opposite side of the drive IC 300. However, the above distance relationship is for exemplification purpose, not for limiting the scope of protection of the present disclosure.

In an embodiment, the protection layer 400 may be disposed adjacent to the drive IC 300, and the protection layer 400 covers at least part of the top surface 300a of the drive IC 300, at least part of the drive IC 300 may be exposed, but the disclosure is not limited thereto.

According to an embodiment of the present disclosure, the protection layer 400 may have moisture-proof or insulation properties, the protection layer 400 is disposed adjacent to the drive IC 300 to protect the circuit of a thin-film transistor or avoid external objects entering the second region 100B (may be circuit region) and causing short-circuiting.

Furthermore, according to an embodiment of the present disclosure, the maximum height H1 of the protection layer 400 is larger than the maximum height H2 of the drive IC 300, and the top surface 400a of the protection layer 400 is higher than the top surface 300a of the drive IC 300, the drive IC 300 will reduce be damaged or broken by the external force, and the surface of the drive IC 300 will reduce probability of being contacted by the conductive elements disposed above the drive IC 300 (such as the conductive adhesive layer 700 disclosed below) and become short-circuited.

In an embodiment, the first substrate 100 may be realized by a thin-film transistor substrate, and the second substrate 200 may be realized by a color filter substrate. However, the present disclosure is not limited thereto, and a color filter may be disposed on the first substrate 100, for example, color filter on array (COA). The display device 10 may be a liquid crystal display, an organic light-emitting diodes (OLED) display, a micro LED, or a mini LED display, but the disclosure is not limited thereto. The LED chip size may be defined as the existing chip about 200 to 300 microns, the LED chip size of a small pitch display chip may be about 150 microns, the LED chip size of a mini LED may be about 50 to 60 microns, the mini LED may be regarded as a micro LED predecessor, the LED chip size of a micro LED may be only 15 microns.

In an embodiment, the first region 100A of the first substrate 100 may further include elements, such as a display medium, black matrix and etc., of a display module. Detailed descriptions of the elements of the display module and the structures thereof are not disclosed below because the elements of the display module and the structures thereof are not essential technical features of the present disclosure and can be understood by any person having ordinarily skill in the technology field of the present disclosure.

In an embodiment, the drive IC 300 may be a chip on glass (COG). In other embodiments, the drive IC 300 may be a chip on PI, PET or PC, but the disclosure is not limited thereto.

In some embodiments as indicated in FIG. 1B, the top surface 400a of the protection layer 400 has a ring-shape and is disposed adjacent to the top surface 300a of the drive IC 300. That is, the protection layer 400 has higher top surface 400a at the part near the peripheral of the drive IC 300. In other embodiments, the top surface 400a of the protection layer 400 may have a flat-shape. In other embodiments, the top surface 400a of the protection layer 400 may have a concave-shape, the protection layer 400 includes a recess correspondingly to the driver IC, but to conform to the protection layer 400 has a higher top surface 400a at the part near the peripheral of the drive IC 300.

In some embodiments, the material of the protection layer 400 may include adhesives, epoxy resin or polyurethane. For example, the protection layer 400 may be an acrylic adhesive, the adhesive may have waterproof or sticky characteristics, or other suitable material, but the disclosure is not limited thereto.

In an embodiment as indicated in FIGS. 1A-1B, the display device 10 may further include a flexible circuit board 500 and a printed circuit board 600, and the drive IC 300 is electrically connected to the printed circuit board 600 through the flexible circuit board 500.

In some embodiments as indicated in FIGS. 1A-1B, the display device 10 may include a plurality of flexible circuit boards 500 and a plurality of drive ICs 300, and the flexible circuit boards 500 and the drive ICs 300 are staggeredly disposed on the first substrate and along an extending direction of one lateral side of the second substrate. The drive ICs 300 are staggeredly disposed along the boundary line 100L of the first substrate 100. Each of the flexible circuit boards 500 may correspond to multiple drive ICs 300. In other embodiments, each of the flexible circuit boards 500 may correspond to one of the drive ICs 300, but the disclosure is not limited thereto. In the present embodiment, in a top view of the display device 10 (as shown in FIG. 1A), each of the plurality of drive ICs 300 does not overlap with the flexible circuit boards 500 in a direction perpendicular to an extending direction D3 of the lateral side 200a and parallel to a top surface 200s of the second substrate 200; one of the flexible circuit boards 500 is disposed between two adjacent ones of the plurality of drive ICs 300 in the top view; there is no any other IC disposed between the two adjacent ones of the plurality of ICs 300; and at least two of the plurality of drive ICs 300 are disposed between two adjacent ones of the flexible circuit boards 500 in the top view. In the present embodiment, two adjacent ones of the plurality of ICs 300 are separated by a space S, at least one of the flexible circuit boards 500 is arranged corresponding to the space S. And the space is greater than one of the at least one of the plurality of flexible circuit board in width along a direction parallel to the lateral side 100a of the first substrate 100.

In an embodiment as indicated in FIG. 1A, the protection layer 400 may cover a portion of the flexible circuit board 500. Specifically, the protection layer 400 may covers a portion of one end of the flexible circuit board 500 connected the first substrate 100, and the other end of the flexible circuit board 500 is connected to the printed circuit board 600, but the disclosure is not limited thereto.

In an embodiment as indicated in FIG. 1B, the display device 10 may further include a conductive adhesive layer 700 and an insulating layer 800. The conductive adhesive layer 700 is disposed above the drive IC 300 and the protection layer 400, and the conductive adhesive layer has a terminal portion 700A disposed on the second substrate 200. The insulating layer 800 is disposed on the conductive adhesive layer 700 and located between the conductive adhesive layer 700 and the protection layer 400. For example, the insulating layer 800 is disposed on the side of the conductive adhesive layer 700 near the first substrate 100. The conductive adhesive layer 700 can resist static electricity or electromagnetic interference, which can maintain display quality. When static electricity is generated in the display region, the static electricity can be guided towards the conductive adhesive layer 700 through a color filter plate, and the static electricity can be further guided towards a back plate, and eliminate. The conductive adhesive layer 700 may be a black adhesive layer for shielding the light. The insulating layer 800 can prevent the electrical contact from occurring between the conductive adhesive layer 700 and the drive IC 300 which results in short-circuiting.

In some embodiments as indicated in FIG. 1B, the insulating layer 800 and the protection layer 400 are separated by a gap G. In some embodiments, the gap G ranges from 0.01 mm to 0.25 mm, but the disclosure is not limited thereto.

In some other embodiments, the insulating layer 800 may contact the protection layer 400, but the insulating layer 800 or the conductive adhesive layer 700 should not deform.

Refer to FIG. 1B. The display device 10 may further include a first polarizer 910 and a second polarizer 920. The first polarizer 910 and the second polarizer 920 are respectively disposed on an outer side of the first substrate 100 and on an outer side of the second substrate 200.

Figure 1C:
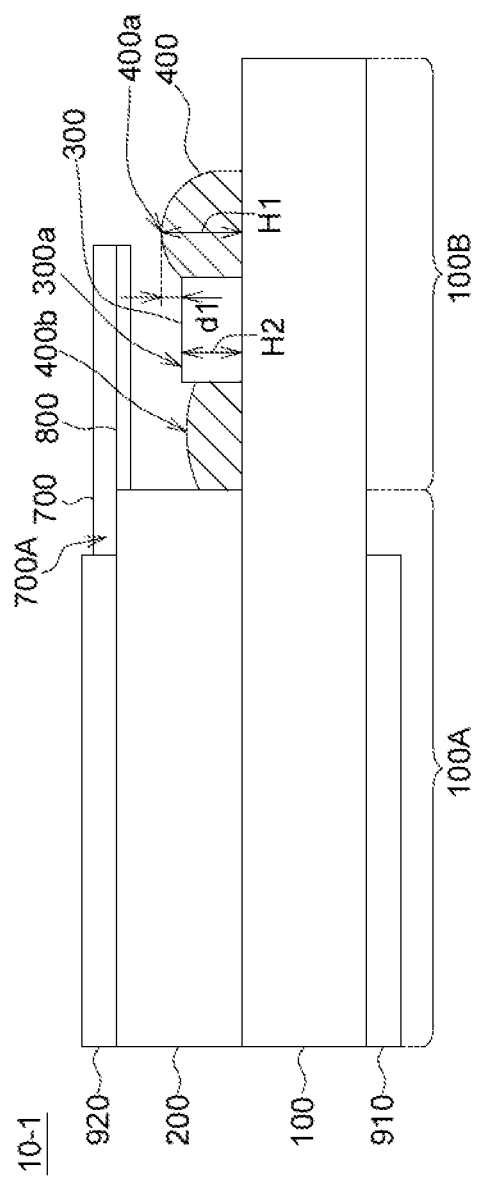
FIG. 1C is a cross-sectional view along the cross-sectional line 1B-1B' of FIG. 1A according to another embodiment.

FIG. 1C is a cross-sectional view along the cross-sectional line 1B-1B' of FIG. 1A according to another embodiment. Designations common to the present embodiment and above embodiments are used to indicate identical or similar elements. Related descriptions of the identical or similar elements can be obtained with reference to above disclosure and are not repeated here.

Figure 1D:
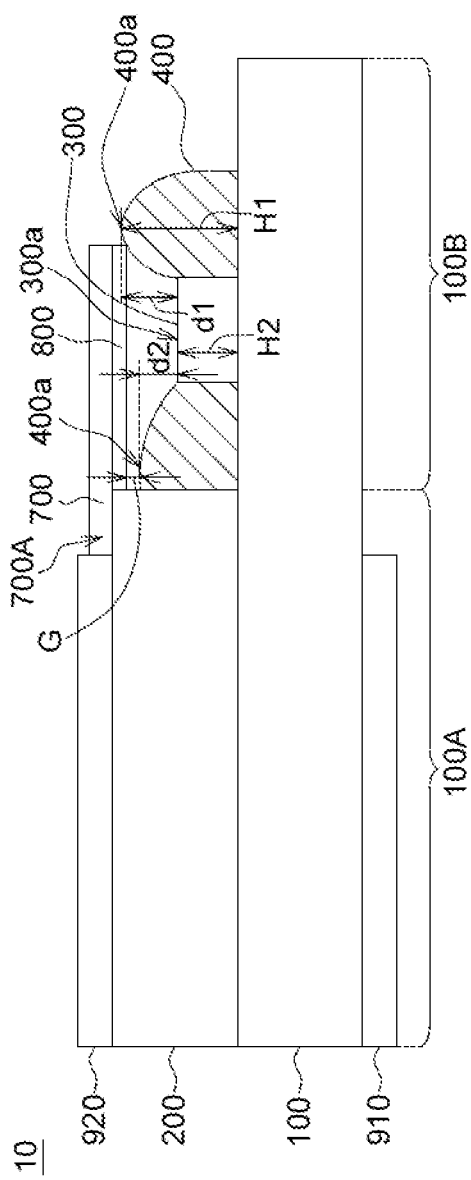
FIG. 1D and FIG. 1E are cross-sectional views along the cross-sectional line 1B-1B' of FIG. 1A, showing alternative embodiments.
Figure 1E:
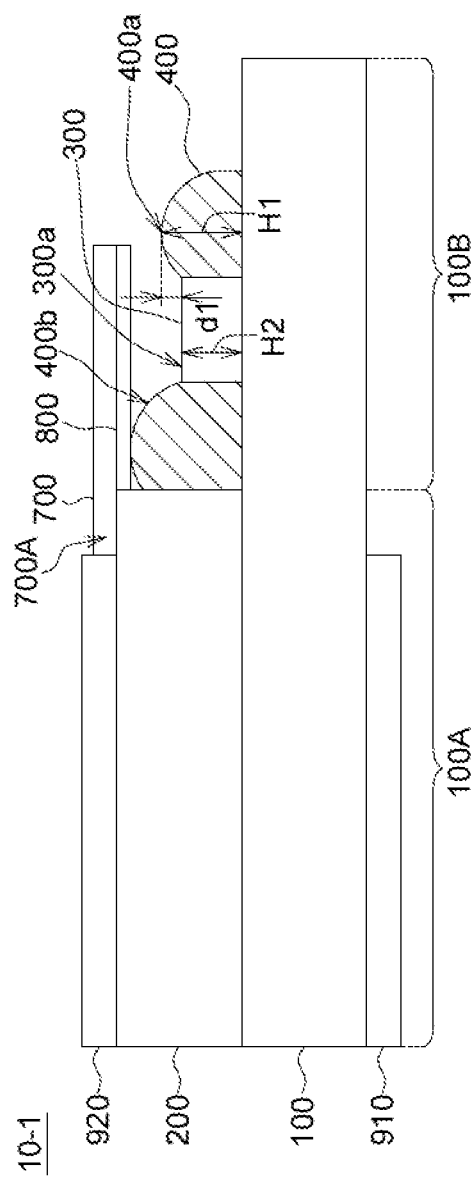

In some embodiments as indicated in FIG. 1C, the top surface 400a of the protection layer 400 is concave-shaped, the shape is similar to a U-shape. The protection layer 400 may be located adjacent to the top surface 300a of the drive IC 300. That is, the protection layer 400 of the present disclosure may have top surfaces 400a and 400b with different heights, wherein the top surface 400a is concave-shaped and higher than the top surface 300a of the drive IC 300, and the portion of the protection layer 400 interposed between the second substrate 200 and the drive IC 300 has the top surface 400b having a height the same with or lower than the top surface 300a of the drive IC 300. In the embodiments, the maximum height H1 of the protection layer 400 is located in the region of the top surface 400a. In some other embodiments, as shown in FIGS. 1D-1E, the insulating layer 800 may contact the protection layer 400.

FIG. 2A is a top view of a display device according to another embodiment of the present disclosure. FIG. 2B is a cross-sectional view along the cross-sectional line 2B-2B' of FIG. 2A. Designations common to the present embodiment and above embodiments are used to indicate identical or similar elements. Related descriptions of the identical or similar elements can be obtained with reference to above disclosure and are not repeated here.

Refer to FIGS. 2A-2B. The display device 20 includes a first substrate 100, a second substrate 200, a drive IC 300 and a protection layer 400. The first substrate 100 has a first region 100A and a second region 100B. The second substrate 200 is correspondingly disposed on the first region 100A of the first substrate 100. The drive IC 300 is disposed on the second region 100B of the first substrate 100. The protection layer 400 may be disposed on the second region 100B of the first substrate 100 and adjacent to the drive IC 300, and the protection layer 400 has a maximum height H1 larger than of a maximum height H2 of the drive IC 300. In other embodiments, a part of the protection layer 400 may be disposed on the first region 100A of the first substrate 100, but the disclosure is not limited thereto.

In an embodiment as indicated in FIGS. 2A-2B, the display device includes a flexible circuit board 500 and a printed circuit board 600. The drive IC 300 is electrically connected to the printed circuit board 600 through the flexible circuit board 500.

In some embodiments as indicated in FIGS. 2A-2B, the flexible circuit board 500 is disposed between the printed circuit board 600 and the drive IC 300.

Figure 3A:
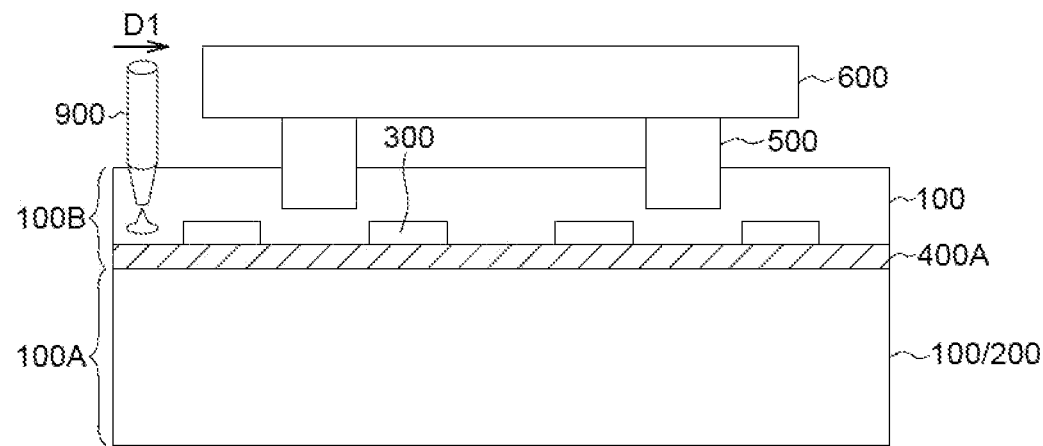
FIG. 3A-FIG. 3C are processes for manufacturing a protection layer of a display device according to an embodiment of the present disclosure.
Figure 3B:
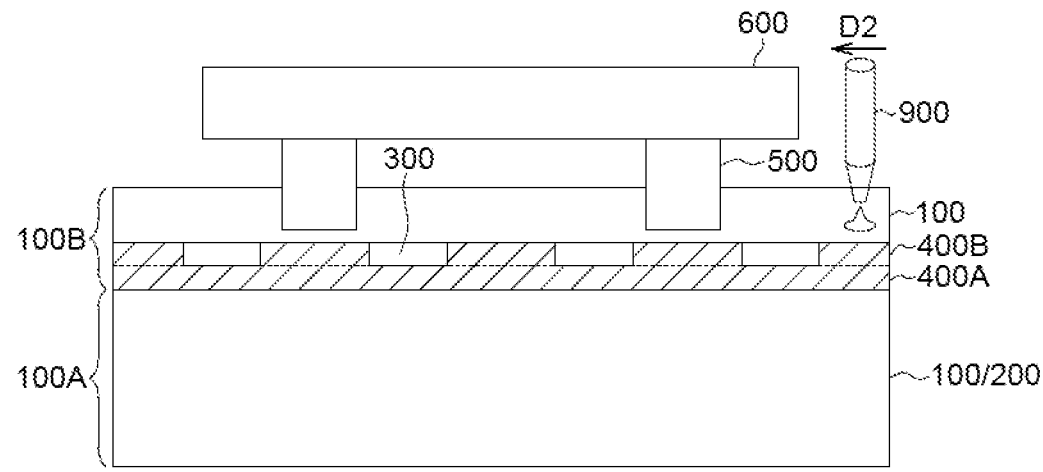
Figure 3C:
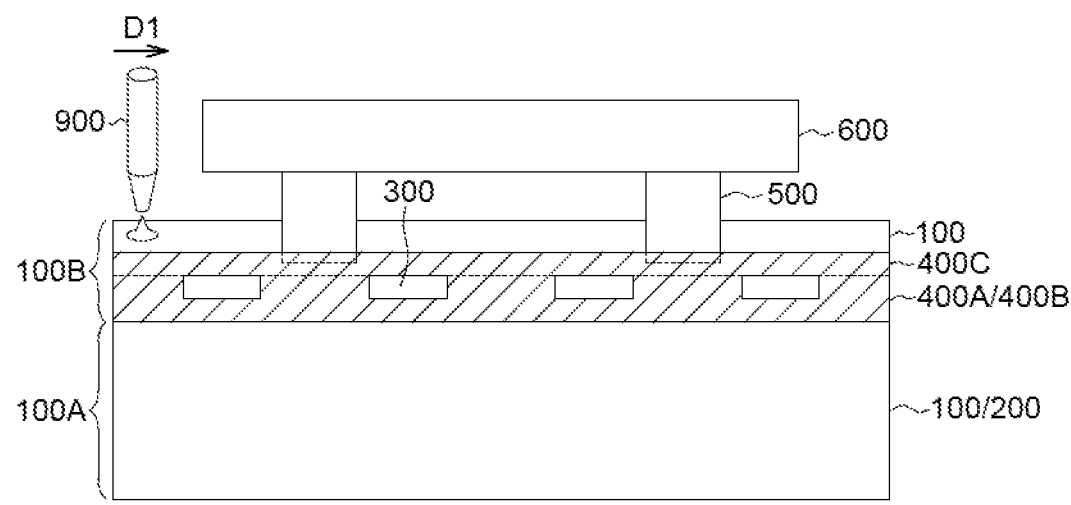

FIG. 3A-FIG. 3C show some processes for manufacturing a protection layer of a display device according to an embodiment of the present disclosure. Designations common to the present embodiment and above embodiments are used to indicate identical or similar elements. Related descriptions of the identical or similar elements can be obtained with reference to above disclosure and are not repeated here.

According to an embodiment of the present disclosure, a manufacturing method of a display device is provided. Refer to FIGS. 1A-FIG. 1B and FIGS. 3A-FIG. 3C. The manufacturing method of the display device includes following steps.

Refer to FIGS. 1A-1B and FIG. 3A. First, a first substrate 100 having a first region 100A and a second region 100B is provided. Next, a second substrate 200 is correspondingly disposed on the first region 100A of the first substrate 100. In other words, the second substrate is disposed on the first substrate and overlapping the first region. Then, a drive IC 300 is disposed on the second region 100B of the first substrate 100. Then, a protection layer 400 is disposed on the second region 100B of the first substrate 100.

In an embodiment, the step of disposing the drive IC 300 in the second region 100B of the first substrate 100 may include the following steps. As indicated in FIG. 3A, a plurality of drive ICs 300 are disposed on the second region 100B of the first substrate 100, wherein the drive ICs 300 may be arranged along an extending direction of one lateral side of the second substrate 200, but the disclosure is not limited thereto. As indicated in FIGS. 1A-1B and FIG. 3A, the extending direction of one lateral side of the second substrate 200 may be substantially parallel to the extending direction of the boundary line 100L between the first region 100A and the second region 100B of the first substrate 100. The boundary line 100L may be defined as the edge of the second substrate 200. In other embodiments, when the shape of the second substrate 200 may be non-rectangular, the drive ICs 300 may be arranged along an applicable extending direction of one lateral side of the second substrate 200, and the extending direction varies according to the shape of the second substrate 200 edge, but the disclosure is not limited thereto. In an embodiment, the step of disposing the protection layer 400 in the second region 100B of the first substrate 100 may include the following steps.

First, as indicated in FIG. 3A, an adhesive may be continuously coated on the first substrate 100 (in the second region 100B), and the adhesive is coated between the drive ICs 300 and the second substrate 200 by a coating device 900. In the present step, an entire strip of the adhesive 400A is coated on the first substrate 100 in the region (the second region 100B) located between the drive ICs 300 and the second substrate 200 along a first coating direction D1.

In some embodiments, the coating height of the adhesive 400A may be higher than the top surface of the drive IC. In some other embodiments, the coating height of the adhesive 400A basically may be the same with or lower than the top surface of the drive IC. In an embodiment, the adhesive may not include any solvent; the adhesive includes sufficient solid content, such that the coating height of the adhesive may be higher than the top surface of the drive IC. Moreover, by adjusting the viscosity and thixotropy of the adhesive, a desired height and a desired shape of the coated product can be achieved by the coating device (the coating equipment), but the disclosure is not limited thereto.

Then, as indicated in FIG. 3B, the adhesive is coated on the first substrate 100 (in the second region 100B) and located between the drive ICs 300 by the coating device 900. In the present step, the adhesive 400B is discontinuously disposed or coated on the first substrate 100 (in the second region 100B), and located in the spacing between the drive ICs 300 along a second coating direction D2, and a distance of spacing is not limited. In an embodiment, the second coating direction D2 and the first coating direction D1 are opposite to each other. In an embodiment, the segmented (discontinuously) coating can be achieved by controlling the adhesive-dispensing operation and the adhesive-stop dispensing operation of the coating device 900.

Then, as indicated in FIG. 3C, the adhesive is continuously disposed or coated on the first substrate 100 and located on a side of the drive IC 300 opposite to the second substrate 200 by the coating device 900 (in the second region 100B). In the present step, an entire strip of the adhesive 400C is disposed or coated on the first substrate 100 (in the second region 100B) and located between the drive ICs 300 along the first coating direction D1.

Refer to FIGS. 1A-1B. A flexible circuit board 500 may be disposed on the second region 100B of the first substrate 100. Referring to FIGS. 1A-1B, a printed circuit board 600 is disposed, and the drive IC 300 is connected to the printed circuit board 600 through the flexible circuit board 500. The second region 100B may be a circuit region for bonding, and the first region 100A includes a display area.

In an embodiment as indicated in FIG. 3C, when an entire strip of the adhesive 400C is continuously disposed or coated on the first substrate 100 and located on a side of the drive IC 300 opposite to the second substrate 200 by the coating device 900, the adhesive 400C is concurrently disposed or coated on a portion of the flexible circuit board 500.

Then, the adhesives 400A, 400B and 400C may be UV curable adhesives, the UV curable adhesives are irradiated by a UV light to form a protection layer 400. In other embodiments, the adhesive 400A, the adhesive 400B and the adhesive 400C may be having low conduction resistance, having moisture resistance, or other suitable adhesives. Referring to FIGS. 1A-1B, the protection layer 400 is disposed enclosing the drive IC 300 and has a maximum height H1 larger than a maximum height H2 of the drive IC 300.

In an embodiment as indicated in FIGS. 1A-1B, 3C, the protection layer 400 formed of the adhesives also covers a portion of the flexible circuit board 500 or a portion of the second substrate 200 edge.

According to an embodiment of the present disclosure, the protection layer 400 formed of the adhesive is a continuum body. In other words, the protection layer 400 according to the embodiment of the present disclosure is integrally formed in one piece and does not have independent parts separated from one another.

According to the conventional gluing and taping process, after the gluing operation is completed, the subsequent taping operation cannot be performed until the solvent of the glue has been vaporized. Since the glue contains low solid content, the coating height is restricted. Moreover, the taping operation cannot be performed by using automation equipment, and therefore is labor consuming or time consuming. Relatively speaking, the protection layer 400 according to an embodiment of the present disclosure is formed of a adhesive through a UV curing process, which requires a shorter processing time, or can be performed using automation equipment without manual operation, and therefore simplifies the manufacturing process or saves processing time. Moreover, the protection layer 400 is formed of one material (adhesive) rather than two materials (glue and tape), and therefore saves material cost.

Refer to FIGS. 1A-1B. In an embodiment, a conductive adhesive layer 700 is disposed above the drive IC 300 and the protection layer 400, wherein the conductive adhesive layer 700 has a terminal portion 700A disposed on the second substrate 200. In an embodiment, an insulating layer 800 is disposed between the conductive adhesive layer 700 and the protection layer 400, wherein the insulating layer 800 and the protection layer 400 are separated by a gap G.

In some other embodiments, the coating height(s) of the adhesive 400A, the adhesive 400B or the adhesive 400C may be close to but smaller than the height of the insulating layer 800 which is formed subsequently, such that the insulating layer 800 will contact the protection layer 400. However, by controlling the coating height of the adhesive 400A, the adhesive 400B or the adhesive 400C, the insulating layer 800 can contact the protection layer 400 but will not be too high and deform the insulating layer 800 and/or the conductive adhesive layer 700.

Refer to FIGS. 1A-1B. In an embodiment, a first polarizer 910 and a second polarizer 920 are respectively disposed on an outer side of the first substrate 100 and on an outer side of the second substrate 200. Thus, the display device 10 of FIGS. 1A-1B is formed.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device, comprising:
    a substrate having an edge;

a plurality of flexible circuit boards disposed on the substrate, wherein in a top view of the electronic device, the plurality of flexible circuit boards are overlapped with the edge of the substrate;

a plurality of ICs disposed on the substrate and arranged along a second direction parallel to an extension direction of the edge of the substrate; and an insulator contacted the plurality of flexible circuit boards and the plurality of ICs, wherein a portion of one of the plurality of flexible circuit boards is disposed between the insulator and the substrate, the insulator fully electrically isolates each of the plurality of flexible circuit boards and has a first side and a second side opposite to the first side, and the first side is closer to the edge than the second side, wherein, along a first direction perpendicular to the extension direction of the edge, a first minimum distance between the second side and one of the plurality of ICs is less than a second minimum distance between the second side and the one of the plurality of flexible circuit boards;

wherein in the top view of the electronic device, two adjacent ones of the plurality of ICs are separated by a space; the one of the plurality of flexible circuit boards is arranged corresponding to the space, and the space is greater than the one of the plurality of flexible circuit boards in width along the second direction.

2. The electronic device according to claim 1, wherein the insulator covers at least part of a top surface of at least one of the plurality of ICs.

3. The electronic device according to claim 1, wherein a part of a top surface of at least one of the plurality of drive ICs is exposed by the insulator.

4. The electronic device according to claim 1, wherein in a cross-sectional view of the electronic device along the first direction, the insulator comprises a first part and a second part disposed on opposite sides of the one of the plurality of ICs, and the second part is disposed between the edge and the one of the plurality of ICs.

5. The electronic device according to claim 4, wherein a first maximum height of the first part is different from a second maximum height of the second part.

6. The electronic device according to claim 5, wherein the second maximum height is greater than the first maximum height.

7. The electronic device according to claim 5, wherein the second maximum height is less than the first maximum height.

8. The electronic device according to claim 1, wherein a third minimum distance between the second side and the edge along the first direction is greater than the first minimum distance and the second minimum distance.

9. The electronic device according to claim 1, wherein a fourth minimum distance between the first side and the edge along the first direction is greater than zero.

10. The electronic device according to claim 1, wherein at least one of the plurality of ICs and the one of the plurality of flexible circuit boards are separated from each other by a distance along the first direction.

11. The electronic device according to claim 1, wherein, in the top view of the electronic device, the one of the plurality of flexible circuit boards is disposed between two adjacent ones of the plurality of ICs.

12. The electronic device according to claim 11, wherein the one of the plurality of flexible circuit boards is separated from the two adjacent ones of the plurality of ICs for different minimum distances.

13. The electronic device according to claim 1, wherein at least one of the plurality of ICs is disposed between two adjacent ones of the plurality of flexible circuit boards.

14. The electronic device according to claim 1, wherein a width of at least one of the plurality of ICs is different from a width of the one of the plurality of flexible circuit boards along the second direction.

15. The electronic device according to claim 1, wherein the insulator is enclosing at least one of the plurality of ICs.

* * * * *